United States Patent [19]

Schwenk et al.

[11] Patent Number: 5,313,370
[45] Date of Patent: May 17, 1994

[54] COMPONENT CARRIER FOR INSERTABLE CIRCUIT BOARDS

[75] Inventors: Hans M. Schwenk; Friedrich Werling, both of Straubenhardt; Hans-Ulrich Güther, Pfinztal, all of Fed. Rep. of Germany

[73] Assignee: Schroff GmbH, Straubenhardt, Fed. Rep. of Germany

[21] Appl. No.: 901,839

[22] Filed: Jun. 22, 1992

[30] Foreign Application Priority Data

Jun. 21, 1991 [DE] Fed. Rep. of Germany ....... 4120873

[51] Int. Cl.$^5$ .......................... H05K 7/12; H05K 7/14
[52] U.S. Cl. ...................... 361/802; 211/41; 361/796; 361/797; 439/64; 439/324; 439/327; 439/377
[58] Field of Search .......................... 211/41, 796, 797; 361/415, 802; 439/64, 324, 327, 59, 377

[56] References Cited

U.S. PATENT DOCUMENTS

| 4,019,099 | 4/1977 | Calabro | 211/41 |
| 4,534,472 | 8/1985 | Hänsler et al. | 361/415 |
| 4,607,751 | 8/1986 | Stracci, Sr. et al. | 211/41 |
| 4,669,616 | 6/1987 | Mazura | 361/415 |
| 4,927,111 | 5/1990 | Takahashi | 361/415 |
| 4,976,358 | 12/1990 | Stickel et al. | 361/415 |
| 5,034,853 | 7/1991 | Mazura et al. | 361/415 |
| 5,044,506 | 9/1991 | Brown | 361/415 |
| 5,154,300 | 10/1992 | Joist | 361/415 |
| 5,156,280 | 10/1992 | Joist | 361/415 |
| 5,170,894 | 12/1992 | Joist et al. | 361/415 |
| 5,191,514 | 3/1993 | Kabat et al. | 361/415 |

FOREIGN PATENT DOCUMENTS 3624883 1/1988 Fed. Rep. of Germany ........ 439/64

Primary Examiner—Leo P. Picard
Assistant Examiner—Donald Sparks
Attorney, Agent, or Firm—Spencer, Frank & Schneider

[57] ABSTRACT

The present invention relates to fastening elements for guide rails at the support rails of a component carrier which is provided to accommodate printed circuit boards equipped with electrical components. The fastening elements are configured as U-shaped spring bars and include a fixed U leg attached to the underside of the guide rails and a free, resilient U leg which is oriented toward the longitudinal web of the support rails. The resilient U leg permits easy insertion of the guide rails into the support rails. The dimensions are such that, after insertion of the guide rails, the resilient U leg stands on the longitudinal web and thus the guide rails are tightly locked against being pulled out.

4 Claims, 3 Drawing Sheets

COMPONENT CARRIER FOR INSERTABLE CIRCUIT BOARDS

CROSS REFERENCE TO RELATED APPLICATION

This application claims the priority of application Ser. No. P 41 20 873.0, filed Jun. 21, 1991, in the Federal Republic of Germany, the subject matter of which is incorporated herein by reference.

BACKGROUND OF THE INVENTION

The present invention relates to a component carrier for insertable printed circuit boards that are equipped with electrical and electronic components, the carrier including front and rear support rails which are provided with laterally shaped on, planar longitudinal webs and are equipped with rows of equidistant centering holes and with guide rails that can be inserted between the support rails and are provided at their top faces with guide grooves for the circuit boards and at their undersides with at least one centering pin at each end which engages in a centering hole. Additionally the guide rails are provided with a spring-elastic fastening element for releasably fastening the guide rails to the support rails.

The invention is employed for component carriers for printed circuit boards of any size and type and is particularly suitable for holding such circuit boards which, because of being equipped with heavy electrical components, have a greater weight.

It is known to fasten guide rails for circuit boards by clamping them in and engaging them at the support rails of the component carriers. Such engageable guide rails can be installed very quickly and easily, but they may have the drawback that they can be removed just as easily without the exertion of force. This means that if the component carrier is subjected to shocks—for example because the device is set down too hard—the inserted circuit boards break out of their guide rails which may be the case, in particular, in connection with larger, tightly packed circuit boards. To overcome this drawback, it has been proposed to screw or rivet the guide rails to the support rails which, however, involves relatively high installation costs. Guide rails that are provided with outwardly projecting tabs which must be bent considerably for installation and removal, are relatively insensitive against being pushed out, but this is offset by the somewhat complicated manual installation.

SUMMARY OF THE INVENTION

It is an object of the present invention to configure a component carrier and its support rails and guide rails so that even circuit boards equipped with heavy components immovably retain their inserted position upon the occurrence of shock stresses—particularly, for example, from earthquakes—with additionally the installation time for the guide rails being kept short and it being possible to position them by machine.

This is accomplished for a component carrier of the above-mentioned type equipped with support rails and guide rails and having spring-elastic fastening elements provided thereon in that the fastening element is configured as a U-shaped spring bar which has a fixed U leg that is attached at a right angle to the underside of the guide rail as well as a resilient free U leg that is oriented toward the longitudinal web of the support rails and whose free end is provided with a contact face for the longitudinal web. The clearance between the contact face of the free U leg and the underside of the guide rail is slightly greater than the thickness of the longitudinal web; the dimension between the outer faces of the free U legs of the two facing spring bars is greater than the clearance between the front edges of the mutually facing longitudinal webs of the front and rear support rails; and, with the guide rail inserted, the contact face of the free U leg stands on the longitudinal web, thus locking the guide rails so that they cannot be pulled out.

Thus, the problem has been solved with the aid of a snap connection composed of two spring bars which, due to their configuration, permit a very easy insertion of the guide rails without the expenditure of any mentionable force. However, removal of the guide rails is possible only with the use of a tool—albeit a very simple one—because the spring bars form a reliable block against removal, like barbs. The proposed locking connection withstands even great shock forces exerted on the component carrier; the limit lies only at the stress limit of the material of the spring bars. The desired easy insertion is realized by the spring characteristics of the free U leg of the spring bar which serves as the locking bar.

Advantageously, the contact face is parallel to the underside of the guide rail. This ensures proper, flush contact of the free U leg on the longitudinal web of the support rail.

According to a further feature of the invention, a contact strip is shaped to the contact face. This contact strip defines the position of the end of the free U leg when the guide rail is inserted.

Another advantage is for the free U leg to be sloped. This measure facilitates the insertion of the guide rail into its intended position.

BRIEF DESCRIPTION OF THE DRAWINGS

The invention will now be described in greater detail with reference to an embodiment thereof and the three attached drawing sheets, in which.

DETAILED DESCRIPTION OF THE PREFERRED EMBODIMENTS

Figure 1:
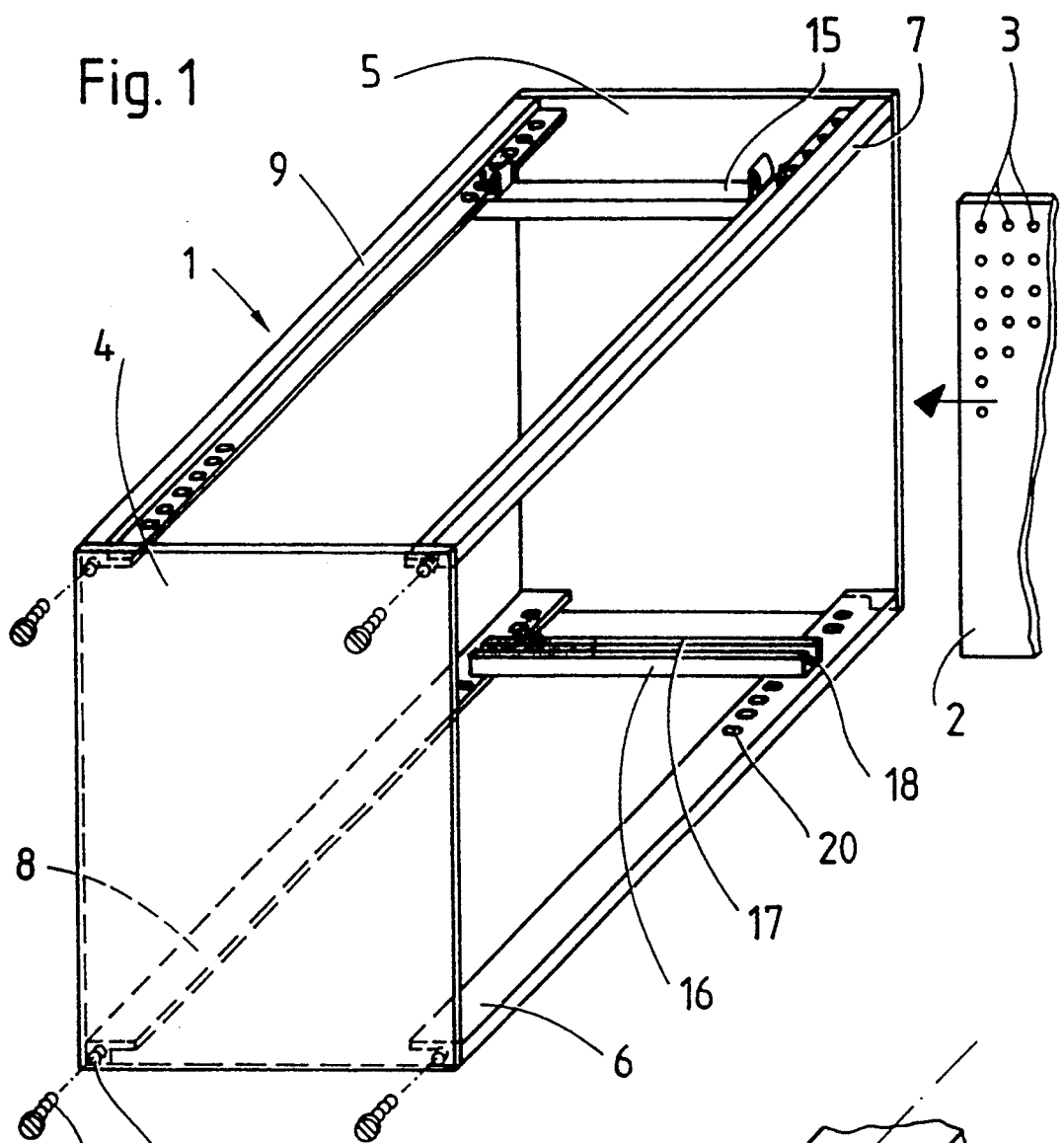
FIG. 1 is a perspective illustration, to a reduced scale, of a component carrier equipped with support rails and two inserted guide rails as well as a circuit board to be inserted.

The component carrier 1 shown in FIG. 1 is provided for insertable printed circuit boards 2 which are provided with a pattern of holes 3 and conductor paths (not shown) and are equipped with various electrical and electronic components (not shown). The component carrier 1 is composed of two rectangular, parallel arranged metal side walls 4 and 5, two front support rails 6 and 7 and two rear support rails 8 and 9.

The four aluminum support rails 6 to 9, which are identically constructed with respect to their profile and their length, lie parallel to one another and are screwed in at the four corners of side walls 4 and 5 with the aid of head screws 10. These head screws 10 pass through holes 11 in side walls 4 and 5 and are screwed into threaded holes 12 provided in support rails 6 to 9 in the longitudinal direction 13 starting at their end faces 14.

To one front support rail 6 or 7 and to one rear support rail 8 or 9 upper and lower guide rails 15 and 16 are releasably fastened by means of spring-elastic fastening elements (which will be described below) transversely to supporting faces 6 to 9.

Each one of the identically configured upper and lower guide rails 15 and 16, which are composed of a solid and tough plastic and are arranged to face toward one another, carries on its top face 17 a linear guide groove 18 having a rectangular cross section to accommodate the circuit board 2 that is to be inserted in the direction of the arrow.

Figure 2:
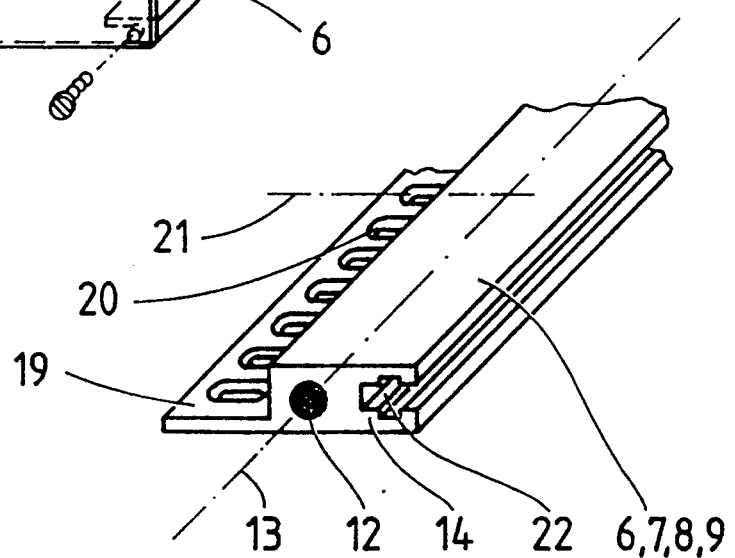
FIG. 2 is a likewise perspective view of part of one of the four support rails of the component carrier of FIG. 1, approximately in natural size.

The four support rails 6 to 9 are each provided—see FIG. 2—with a laterally shaped on, planar thin longitudinal web 19 which extends in longitudinal direction 13. The underside of longitudinal web 19 (FIG. 2) lies in the same plane as the undersides of support rails 6 to 9. This longitudinal web 19 is shaped onto support rails 6 to 9.

Longitudinal web 19 is provided with centering holes 20. In the present case, these are long holes provided to compensate for manufacturing tolerances; their longitudinal axes 21 lie transversely at an angle of 90° to the longitudinal direction 13 of support rails 6 to 9. A profiled longitudinal groove 22 serves for the attachment of further components (not shown).

Each one of the guide rails 15 and 16 carries on its underside 23 (see FIG. 3) centering pins 24 which project at a right angle, and which have a conical tip 25. A centering pin 24 or a pair of such centering pins is disposed near each one of the two ends of guide rails 15 and 16 and each engages in one of the centering holes 20 of a front support rail (6 or 7) and a rear support rail (8 or 9) of support rails 6 to 9. In addition to centering pins 24, a fastening element is provided in each case. The two fastening elements face one another.

Each fastening element (FIG. 3) is configured as a U shaped spring bar 26, 26'. This spring bar includes a fixed U leg 27 and a free U leg 28 which both are connected with one another by way of an arcuate U base that approximately corresponds to a half circle.

Figure 3:
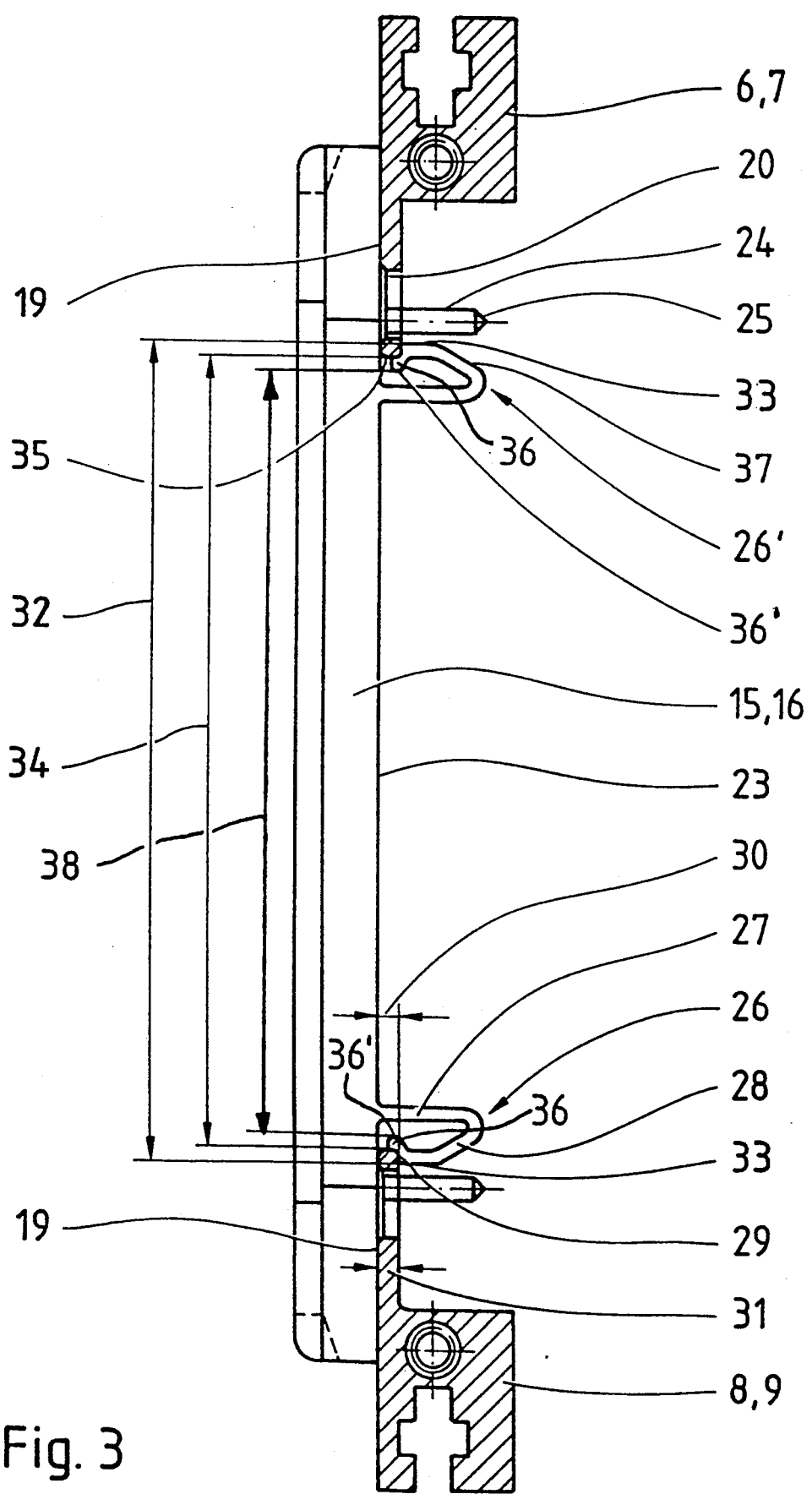
FIG. 3 is a side view, somewhat enlarged, of a guide rail according to the invention in the component carrier of FIG. 1, inserted and locked in a front and a rear support rail.
Figure 4:
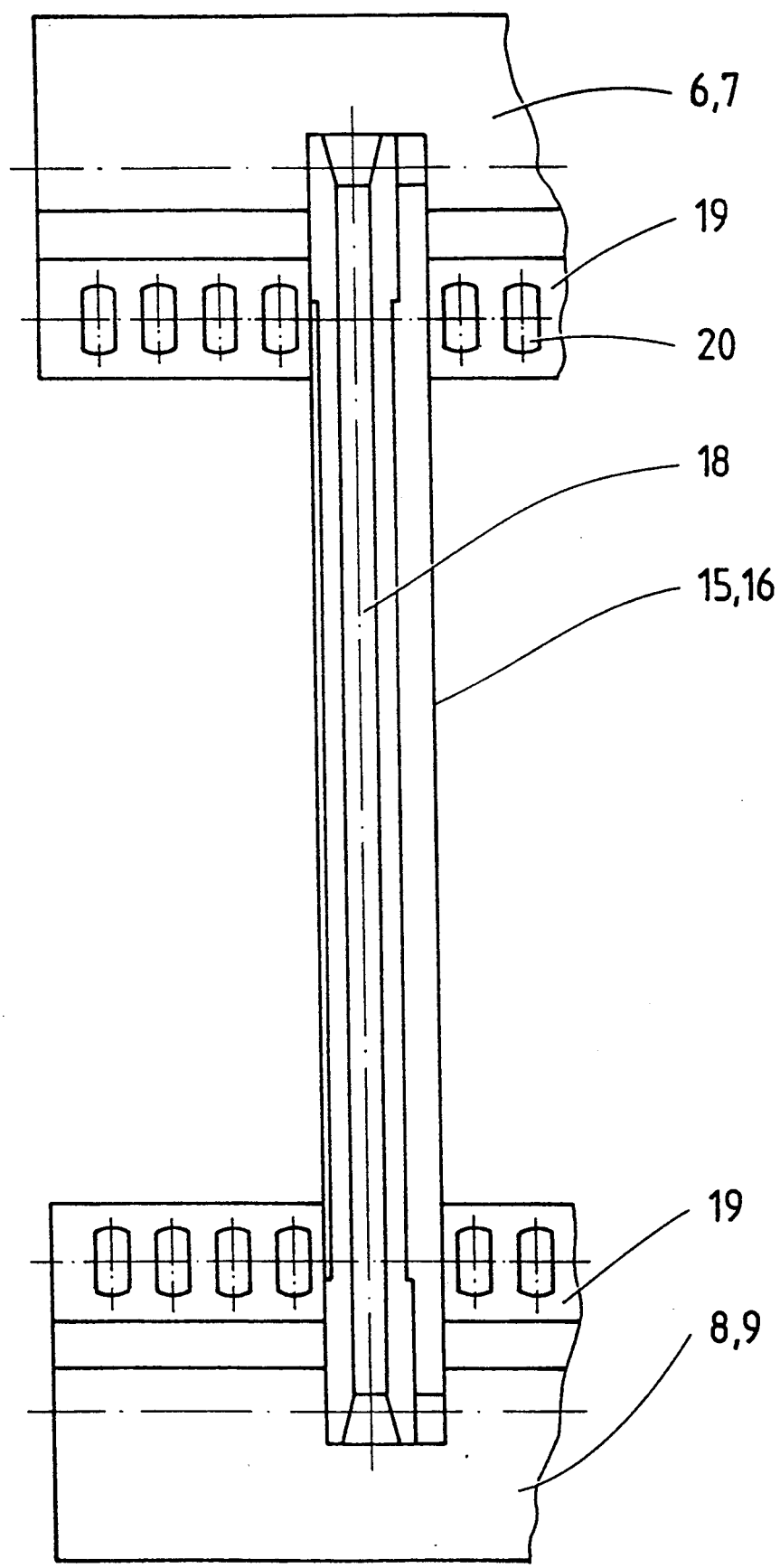
FIG. 4 is a top view of the guide rail of FIG. 3 including parts of the two support rails.

The fixed U leg 27 is attached or shaped, respectively, at a right angle to the underside 23 of guide rails 15 and 16. The free, resilient and bent-back U leg 28 is oriented—as indicated in FIG. 3—toward longitudinal web 19 of support rails 6 to 9, with guide rails 15 and 16 inserted into support rails 6 to 9, and at its free end it carries a contact face 29 for longitudinal web 19. The arrangement of the two spring bars 26 and 26' of each guide rail 15 and 16, respectively, is such that the two fixed U legs 27 ar oriented inwardly and toward one another while the two free U legs 28 are oriented outwardly and toward the two ends of guide rails 15 and 16.

The clearance 30 between the contact faces 29 of the free U legs 28 and the undersides 23 of guide rails 15 and 16, respectively, is slightly greater than the thickness 31 of longitudinal web 19 of support rails 6 to 9. Moreover, the dimension 32 between the exterior faces 33 of the free U legs 28 of the two opposing spring bars 26 and 26' is greater than the clearance 34 between the front edges 35 of the facing longitudinal webs 15 of the front support rails (6, 7) and the rear support rails (8, 9). The consequence of these dimensions is that, with guide rails 15 and 16 inserted, the contact faces 29 of the two free U legs 28 of the two fastening elements stand on the two longitudinal webs 19 and thus firmly lock guide rails 15 and 16 against being pulled out. Contact face 29 at the free end of the free U leg 28 lies parallel to the underside 23 of guide rails 15 and 16, respectively. This contact face 29 has a laterally shaped on contact strip 36 which, when guide rails 15 and 16 are inserted, lies against the front edge 35 of the respective longitudinal web 19 and, together with contact face 29, forms a small, somewhat V-shaped trough for front edge 35.

The free U leg 28 of each of the two spring bars 26 and 26' is provided with a slope 37 which is formed by a bend in U leg 28 and facilitates the insertion of guide rails 15 and 16.

In order to insert guide rails 15 and 16—which can easily be done by hand or also by machine—the centering pins 24 provided at both ends are brought into engagement, at the location provided for the respective guide rail 15 and 16 in component carrier 1, with the corresponding centering holes 20 in front support rails 6 and 7, respectively, and in rear support rails 8 and 9, respectively; then a slight pressure is exerted uniformly onto both ends of the upper side of guide rails 15 and 16, respectively. This causes the slopes 37 of the two free U legs 28 of spring bars 26 and 26' to slide along the front edges 35 of longitudinal webs 19 so that the free U legs 28 are bent and increasingly urged in the direction toward the fixed U legs 27. As soon as the undersides 23 of guide rails 15 and 16 lie flush on the longitudinal webs 19 of the two support rails 6 and 7, respectively, and 8 and 9, respectively, U legs 28 snap over longitudinal webs 19 in the direction toward centering pins 24 until contact faces 29 stand on longitudinal webs 19, thus retaining the guide rail 15 and 16 and securing them against being pulling out.

For the purpose of removing a guide rail 15 or 16 it is necessary to employ a simple tool with which the free, resilient U legs 28 must be bent back until their contact faces 29 release longitudinal webs 19. Contact strip 36 fixes the position of the free U leg 28 when guide rails 15 and 16 are inserted and serves as a delimiting stop when the leg is bent back. As shown in FIG. 3, the contact strip 36 of the spring bars 26, 26' has an outer face 36'. The outer faces 36' of the contact strips 36 of the two spring bars 26, 26' are oriented toward one another and are spaced from one another at a clearance 38 which, in the installed (snapped-in) position shown, is less than the clearance 34 between the front edges 35 of the support rails 6 and 8 or 7 and 9.

It will be understood that the above description of the present invention is susceptible to various modifications, changes and adaptations, and the same are intended to be comprehended within the meaning and range of equivalents of the appended claims.

What is claimed is:

1. In a component carrier for insertably receiving printed circuit boards on which electronic components are mounted; the component carrier including two fixedly held, parallel support rails each having a longitudinally extending, lateral web; said webs having respective facing longitudinal edges being spaced at a first clearance from one another; each said web having a thickness;

a longitudinal guide rail extending transversely to said support rails and having an underside oriented towards said support rails and a top side oriented away from said support rails; an upwardly open, longitudinal groove provided in the top face of said guide rail for receiving a marginal edge zone of a printed circuit board therein;

resilient securing means for holding said guide rail against said support rails by a snap-in engagement;

the improvement wherein said resilient securing means comprises a first and a second U-shaped spring bar affixed to said underside of said guide rail at opposite first and second end portions thereof, respectively; each said spring bar including (a) a first leg affixed to and extending perpendicularly away from said underside of said guide rail;

(b) a resilient second leg adjoining said first leg and extending towards said underside; said resilient second leg including a free end portion having an outer face oriented towards an adjacent end of said guide rail; a distance between the outer face of said second leg of said first spring bar and the outer face of said second leg of said second spring bar being greater than said first clearance;

(c) a contact face formed on said free end portion and extending parallel to said underside of said guide rail and being at a second clearance therefrom; said engagement face being in a face-to-face contact with an underside of said web whereby pulling away of said guide rail from said webs is being resisted; said second clearance being more than said thickness of said web; and (d) a contact strip formed on the free end portion of said second leg adjacent said engagement face; said contact strip having an outer face; said outer face of said contact strip of said first spring bar and said outer face of said contact strip of said second spring bar being oriented toward one another and being separated from one another by a clearance less than said first clearance.

2. The component carrier as defined in claim 1, wherein said second leg of said first and second spring bar has an oblique length portion between said outer face and a location of connection between said first and second legs.

3. The component carrier as defined in claim 1, further comprising (e) a series of equidistant centering holes provided in the web of said first and second support rails along a length dimension thereof; each said centering hole being elongated and having a length dimension oriented perpendicularly to the length dimension of said support rails; and (f) a first and a second centering pin affixed to and extending from the underside of said guide rail at opposite end portions thereof; said first centering pin being received in a centering hole in the web of said first support rail and said second centering pin being received in a centering hole in the web of said second support rail.

4. The component carrier as defined in claim 1, wherein a face of said contact strip and said contact face together form a cross-sectionally generally V-shaped trough.

* * * * *

UNITED STATES PATENT AND TRADEMARK OFFICE
CERTIFICATE OF CORRECTION

PATENT NO. : 5,313,370
DATED : May 17, 1994
INVENTOR(S) : Hans Martin Schwenk et al It is certified that error appears in the above-indentified patent and that said Letters Patent is hereby corrected as shown below:

On the title page, line 3 of item [75], the third inventor's name should read --Günther--.

Signed and Sealed this

Thirteenth Day of September, 1994

Attest:

BRUCE LEHMAN

Attesting Officer

Commissioner of Patents and Trademarks